(12) United States Patent
Gruening-Von Schwerin

(10) Patent No.: US 7,696,041 B2
(45) Date of Patent: Apr. 13, 2010

(54) METHOD FOR FABRICATING A SEMICONDUCTOR COMPONENT AND SEMICONDUCTOR COMPONENT

(75) Inventor: Ulrike Gruening-Von Schwerin, Munich (DE)

(73) Assignee: Qimonda AG, Munich (DE)

( * ) Notice: Subject to any disclaimer, the term of this patent is extended or adjusted under 35 U.S.C. 154(b) by 23 days.

(21) Appl. No.: 11/413,320

(22) Filed: Apr. 28, 2006

(65) Prior Publication Data

US 2006/0252222 A1    Nov. 9, 2006

(30) Foreign Application Priority Data

May 4, 2005    (DE) .................. 10 2005 020 897

(51) Int. Cl.
*H01L 21/8242* (2006.01)
(52) U.S. Cl. ............... 438/243; 438/386; 438/387; 438/E21.019
(58) Field of Classification Search ......... 438/253–255, 438/396–398, 243–244; 257/E21.019, E21.578
See application file for complete search history.

(56) References Cited

U.S. PATENT DOCUMENTS

| | | | |
|---|---|---|---|
| 5,580,811 A | 12/1996 | Kim | |
| 6,187,625 B1 | 2/2001 | Lin et al. | |
| 2002/0090779 A1* | 7/2002 | Jang | 438/243 |
| 2003/0003642 A1* | 1/2003 | Oh | 438/200 |
| 2004/0007725 A1 | 1/2004 | Son | |
| 2008/0099817 A1* | 5/2008 | Shea | 257/309 |

OTHER PUBLICATIONS

German Office Action dated Nov. 23, 2005.

* cited by examiner

*Primary Examiner*—Dung A. Le
(74) *Attorney, Agent, or Firm*—Eschweiler & Associates, LLC

(57) ABSTRACT

In a method for fabricating a semiconductor component, a semiconductor substrate comprising a first surface is provided and a shaping matrix is applied to the first surface. The shaping matrix comprises at least one continuous depression arranged in such a way that contact regions in a region of the first surface are at least partly uncovered. A sacrificial layer is applied to sidewalls of the continuous depression in an upper section of the depression, a first electrode is produced by applying a first conductive layer in a lower section of the depression and to the sacrificial layer, and the sacrificial layer is removed in order to uncover the sidewalls of the shaping matrix in the upper section. A dielectric layer is applied to the first conductive layer and a second electrode is formed by applying a second conductive layer to the dielectric layer.

10 Claims, 15 Drawing Sheets

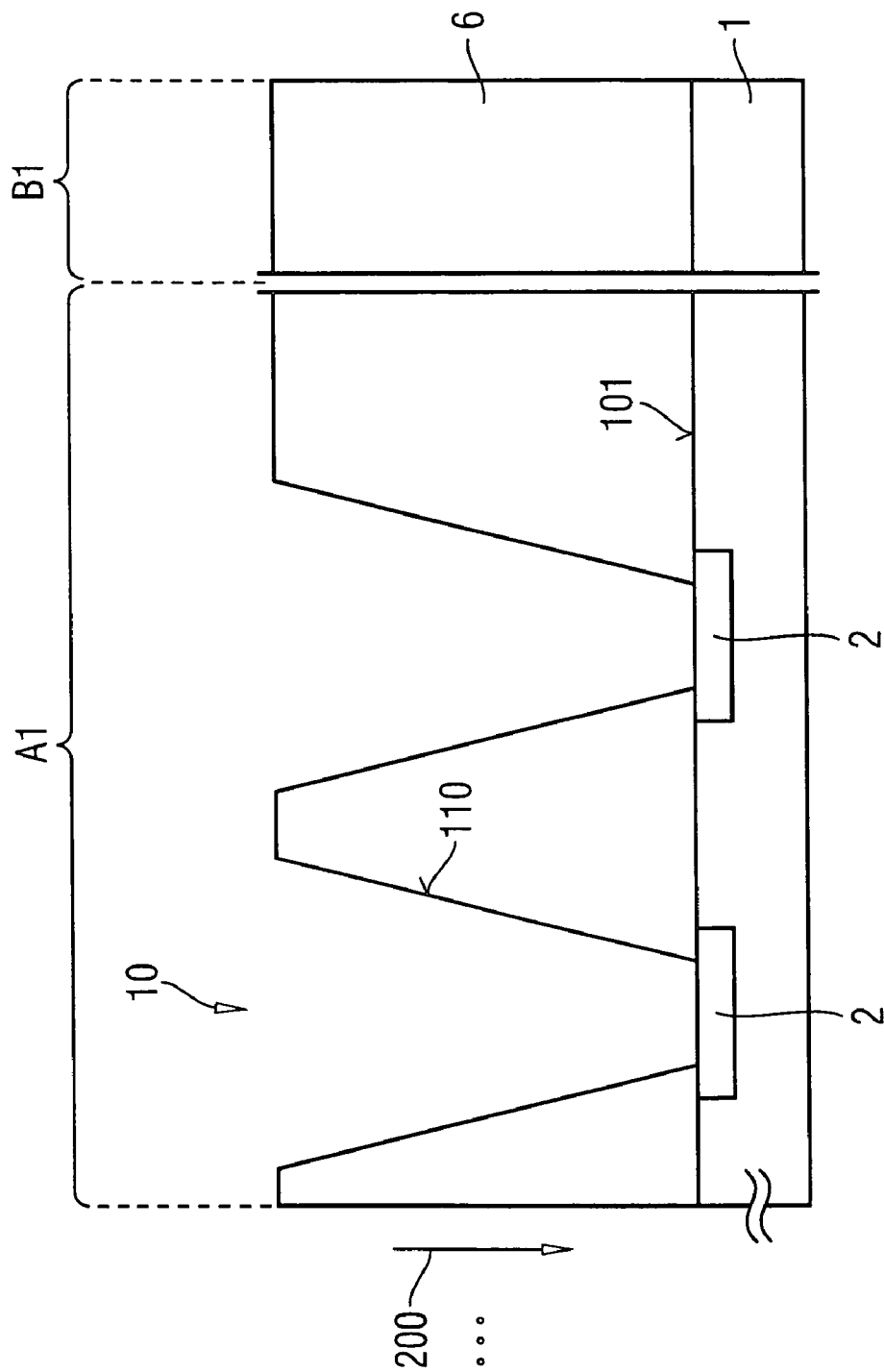

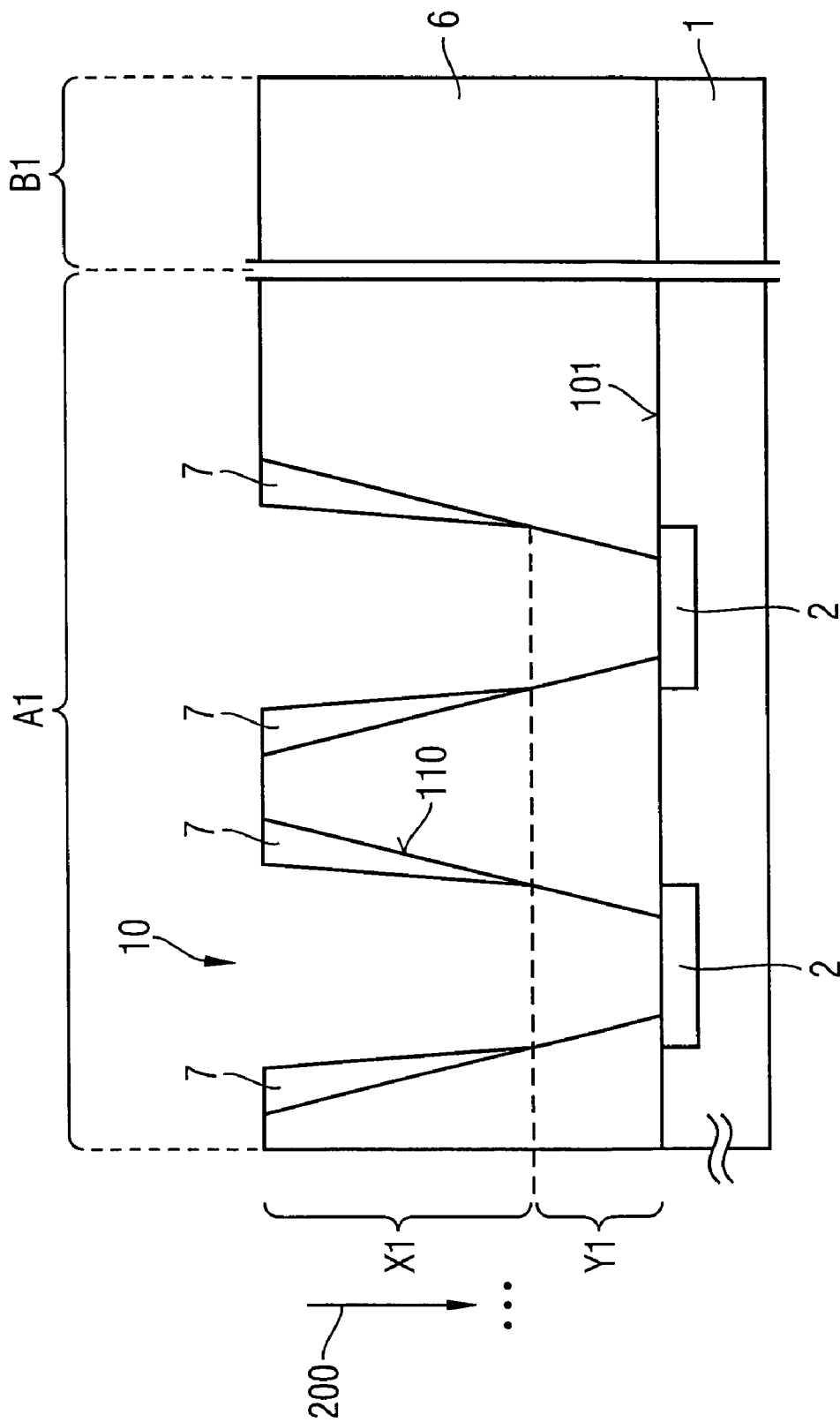

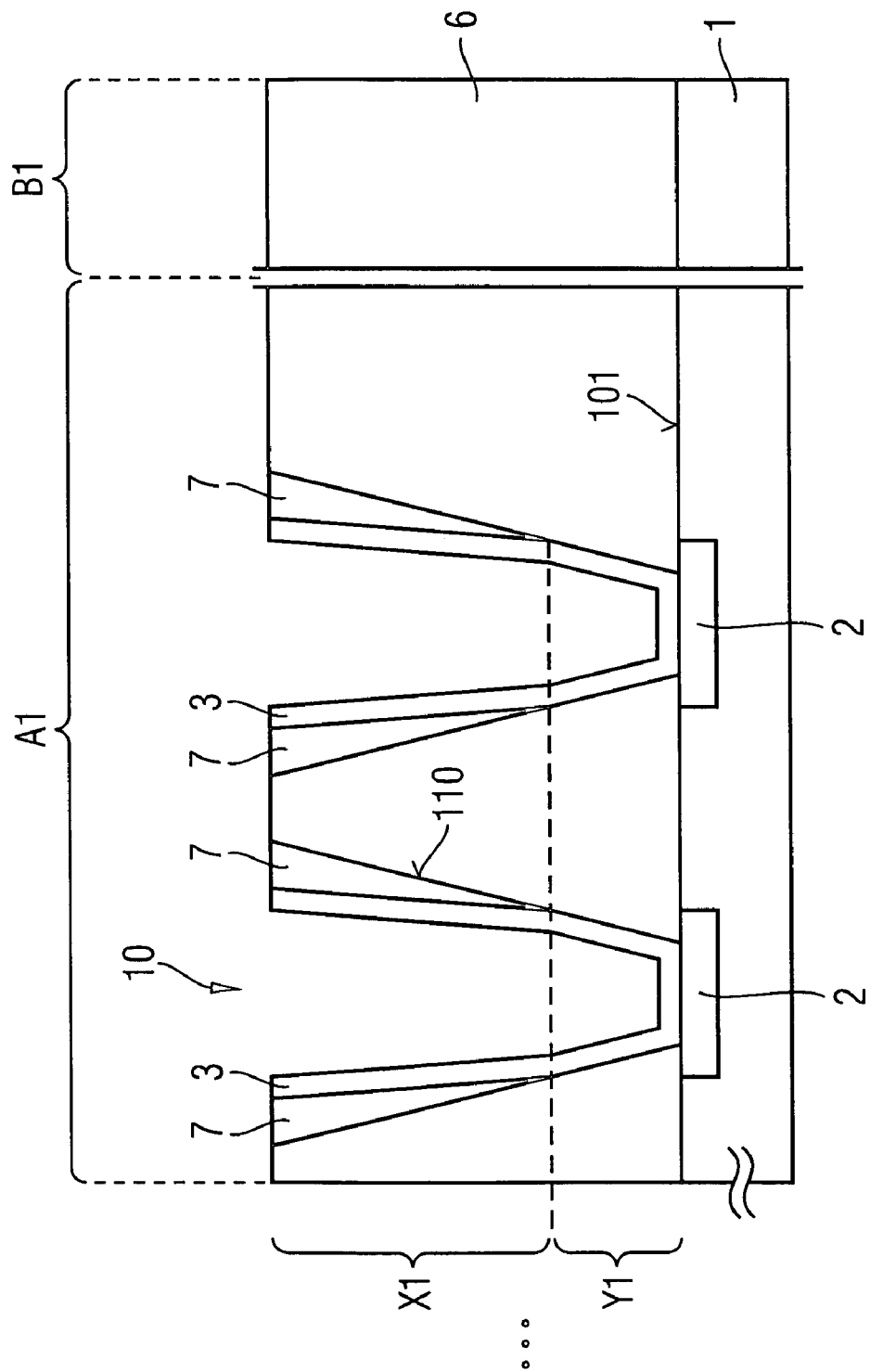

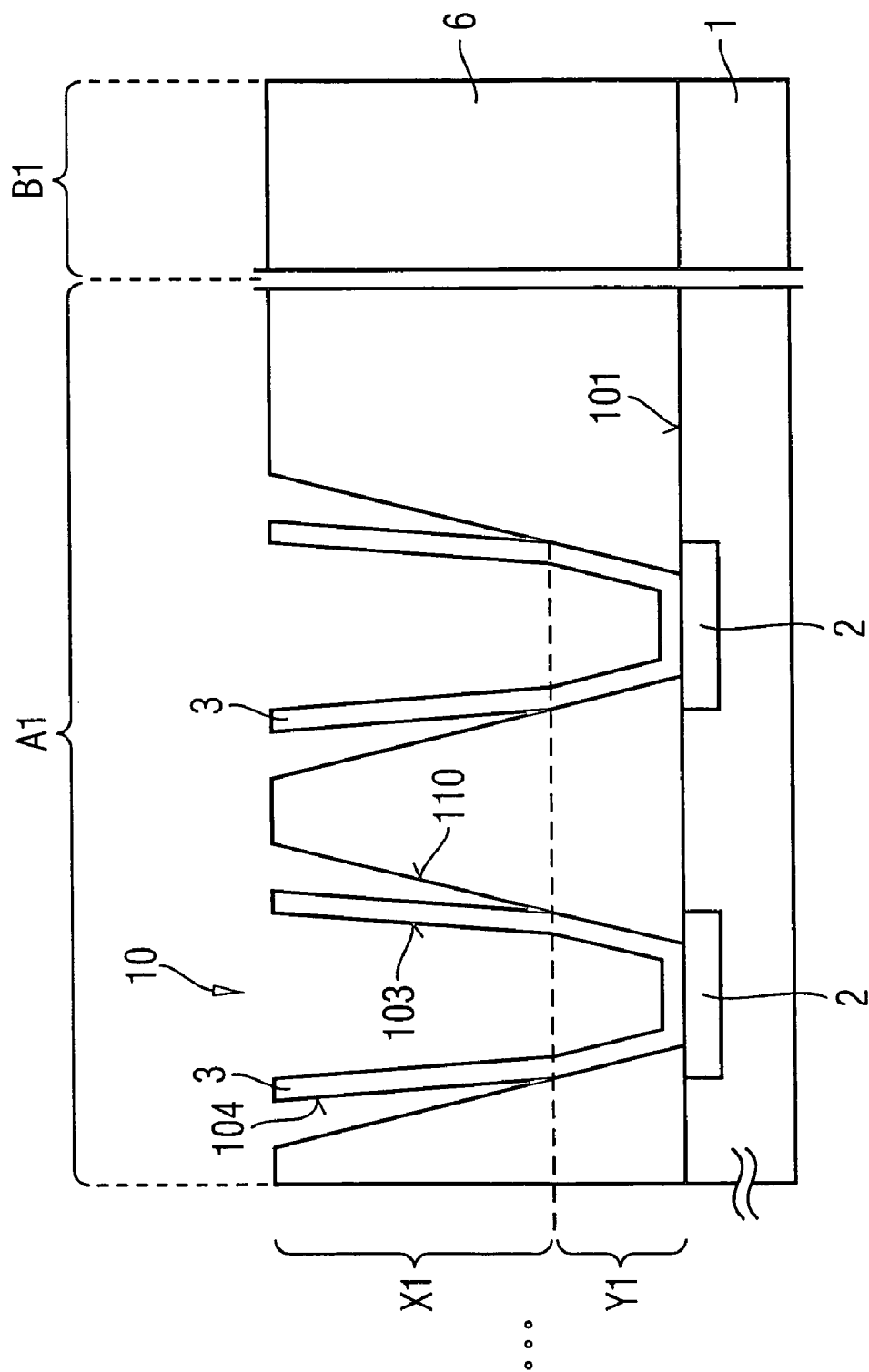

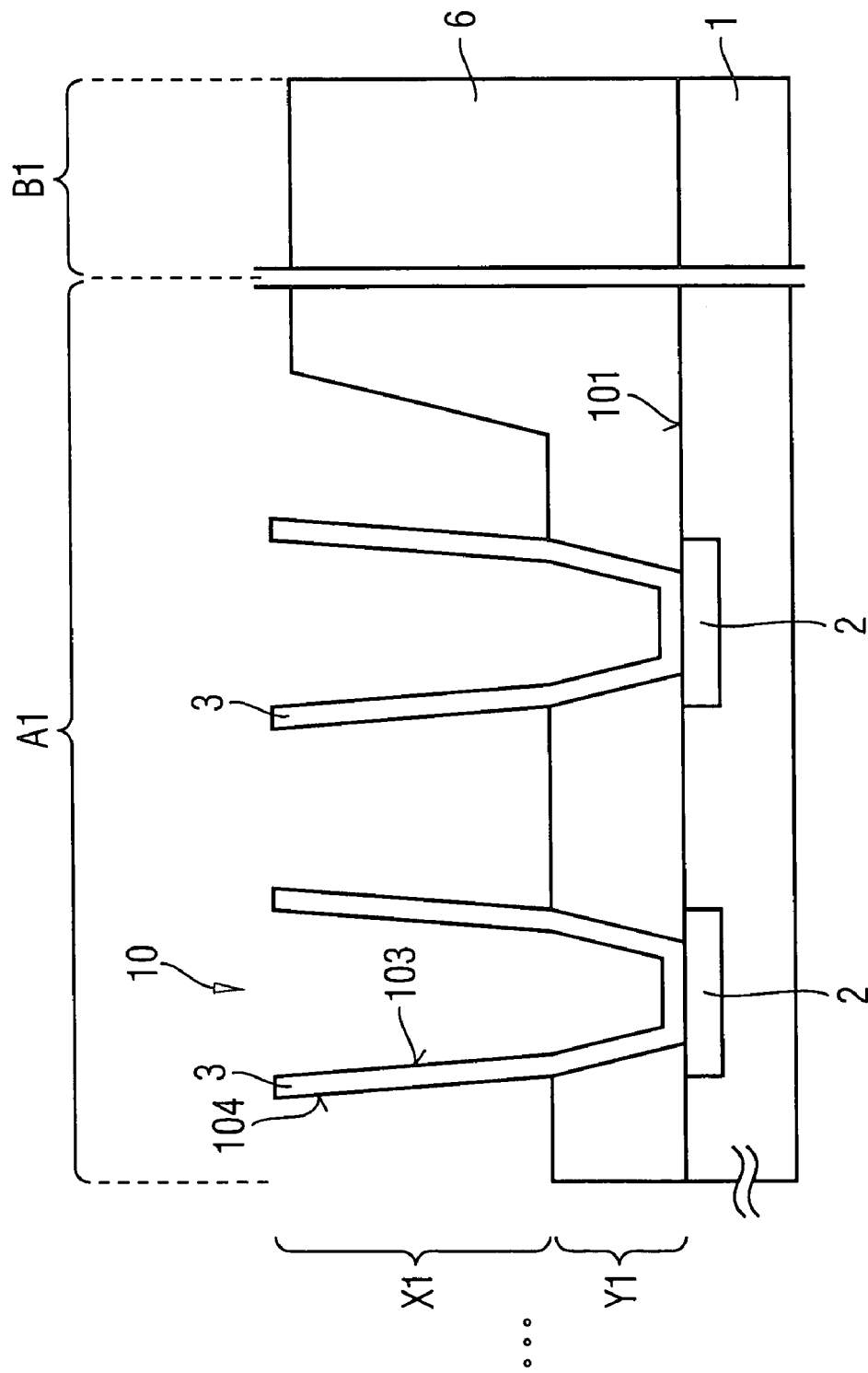

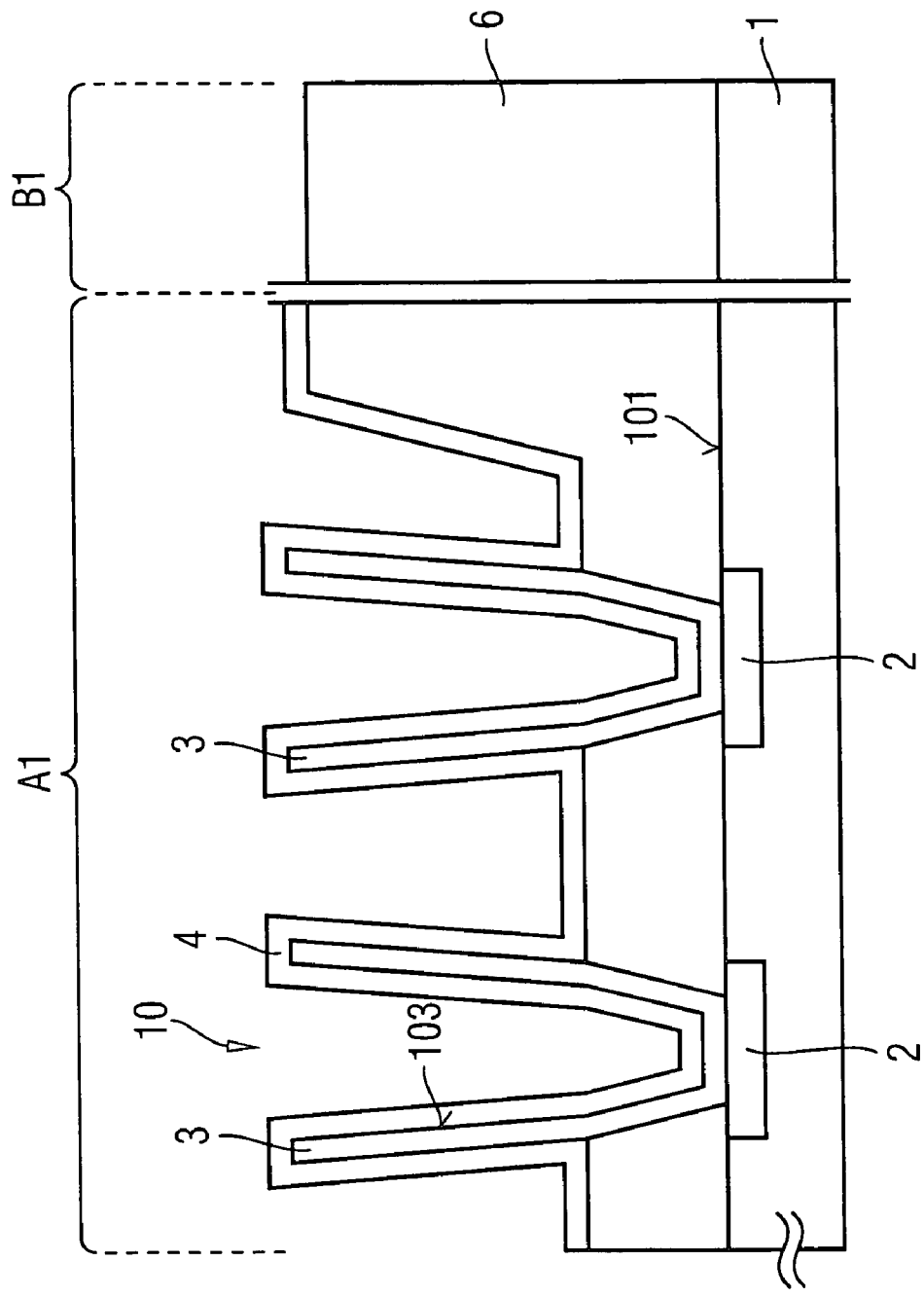

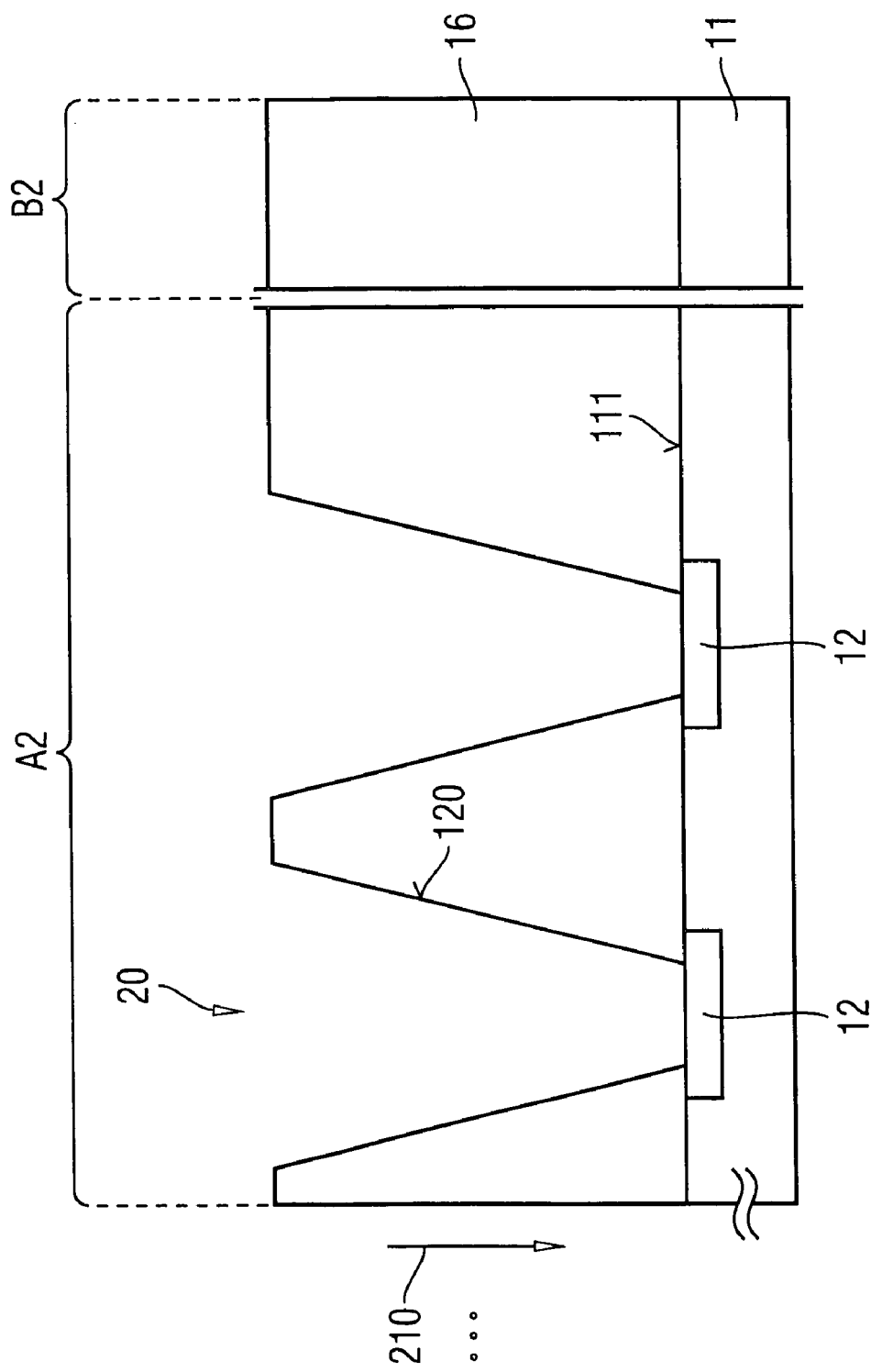

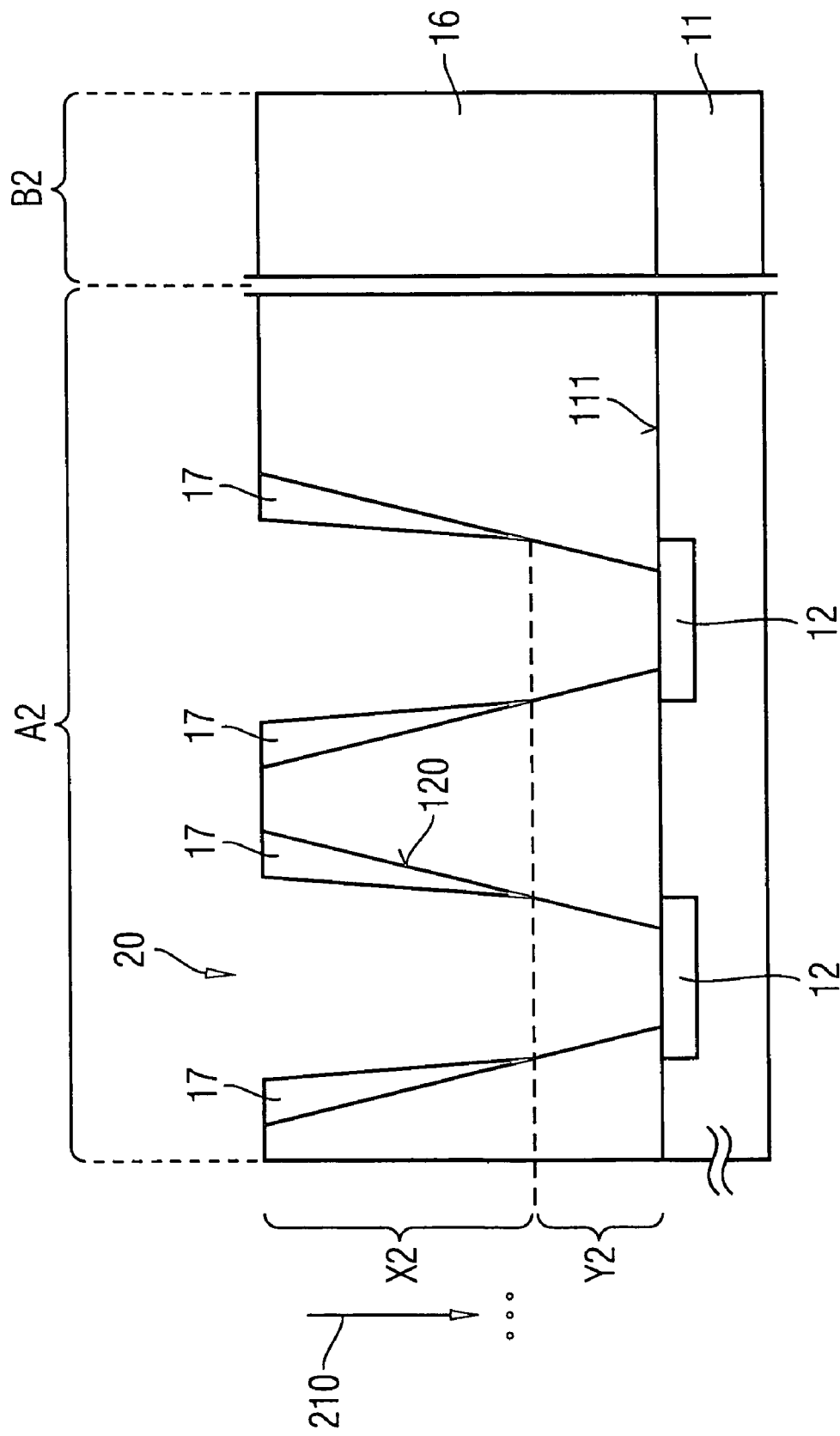

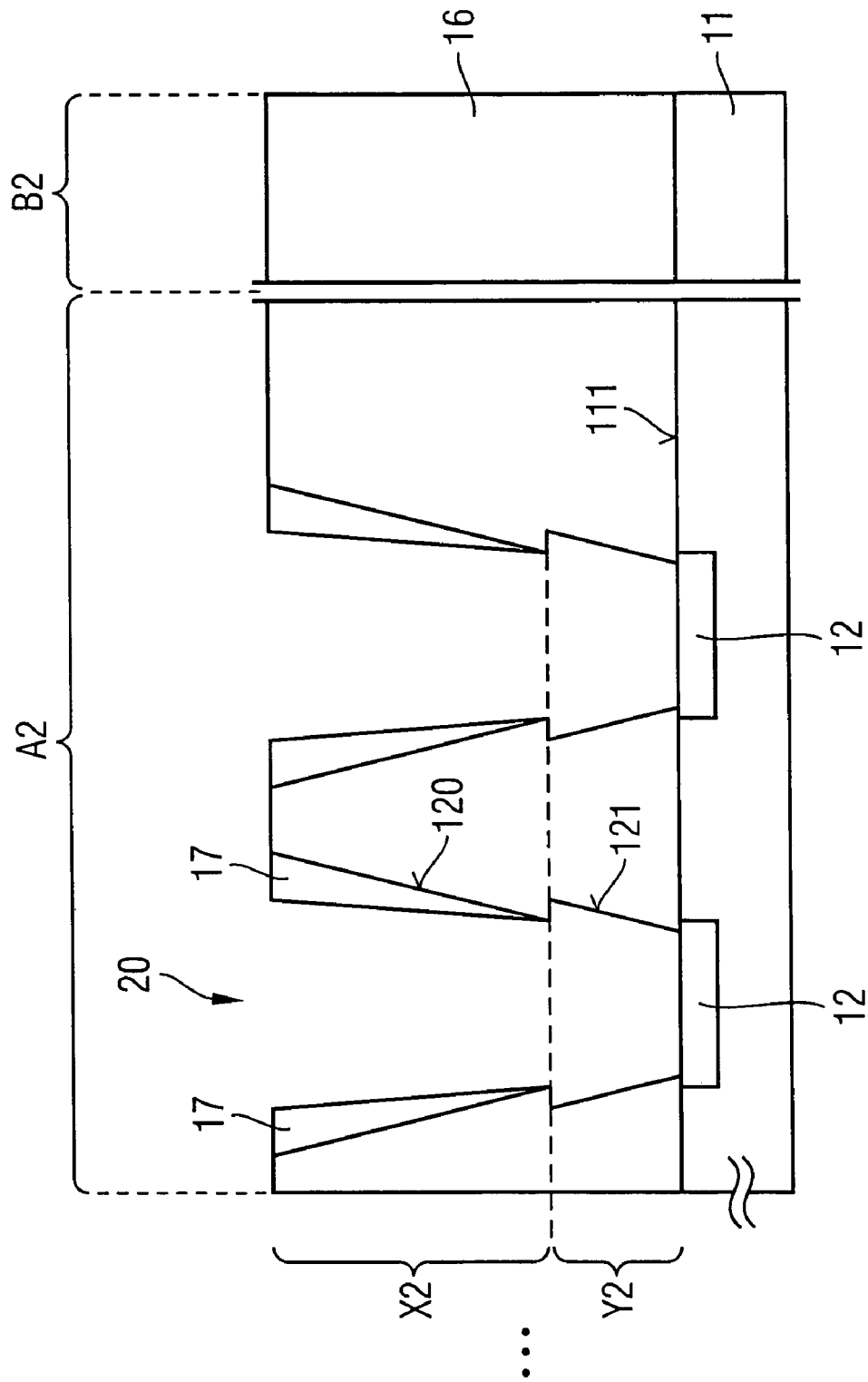

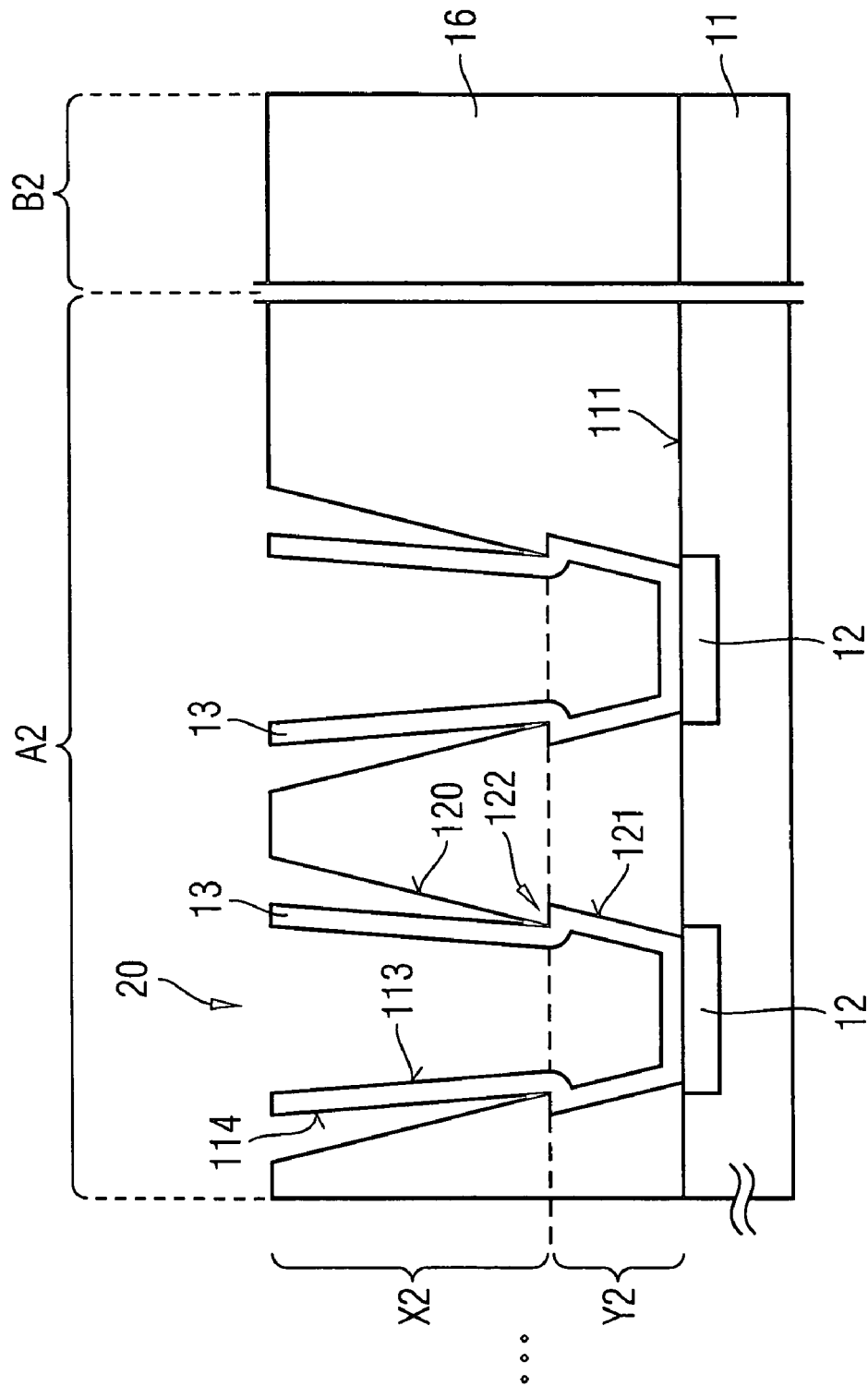

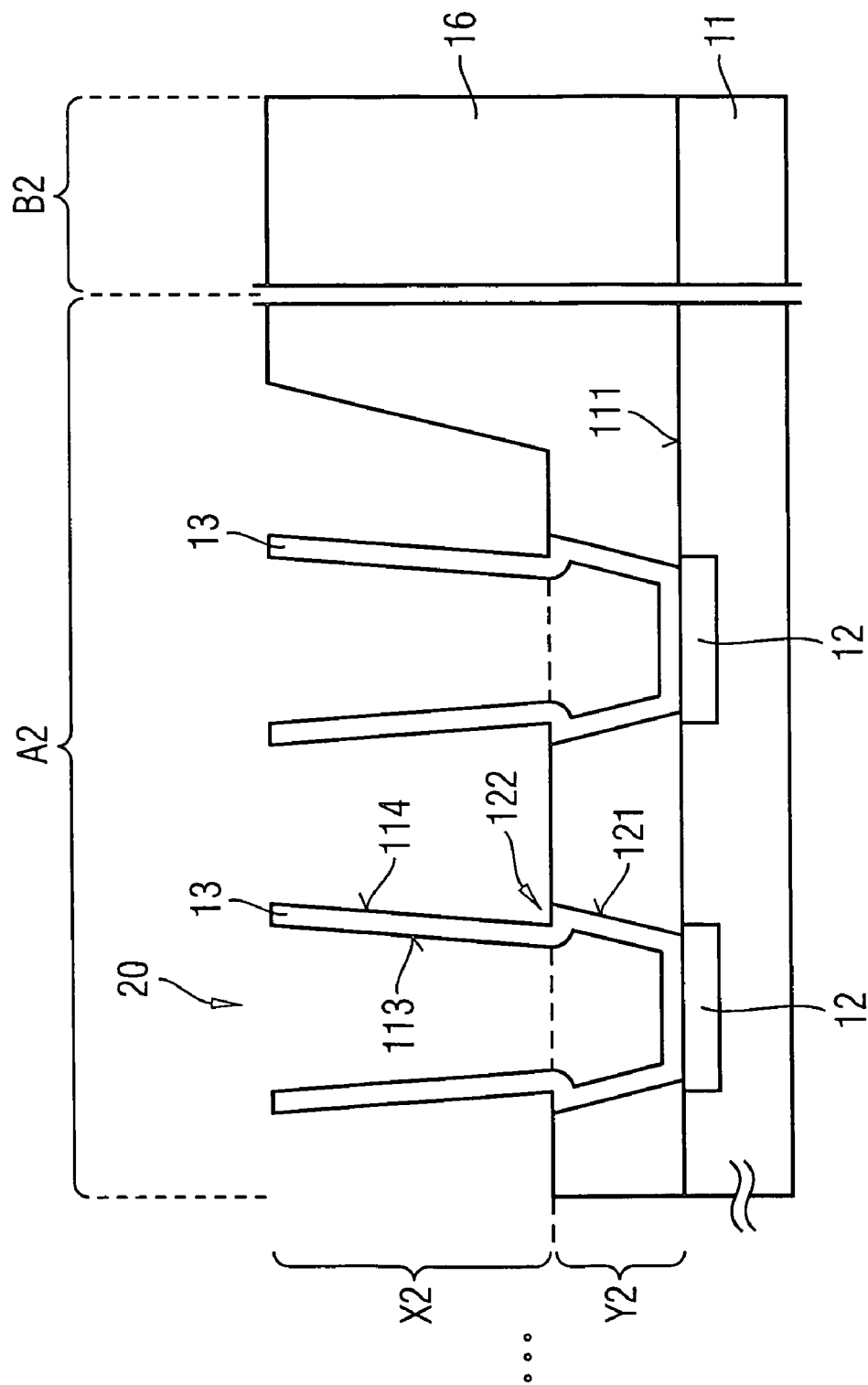

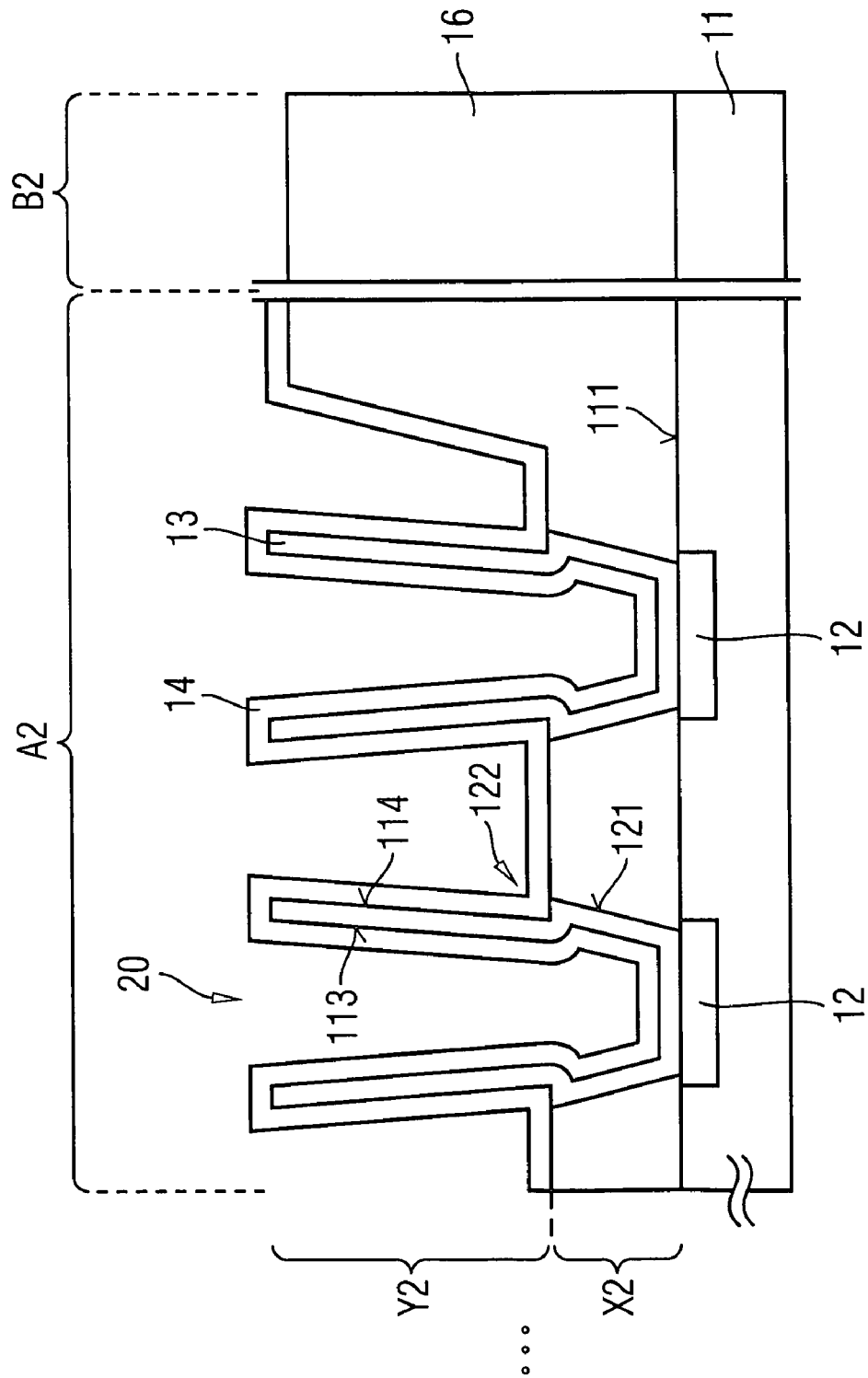

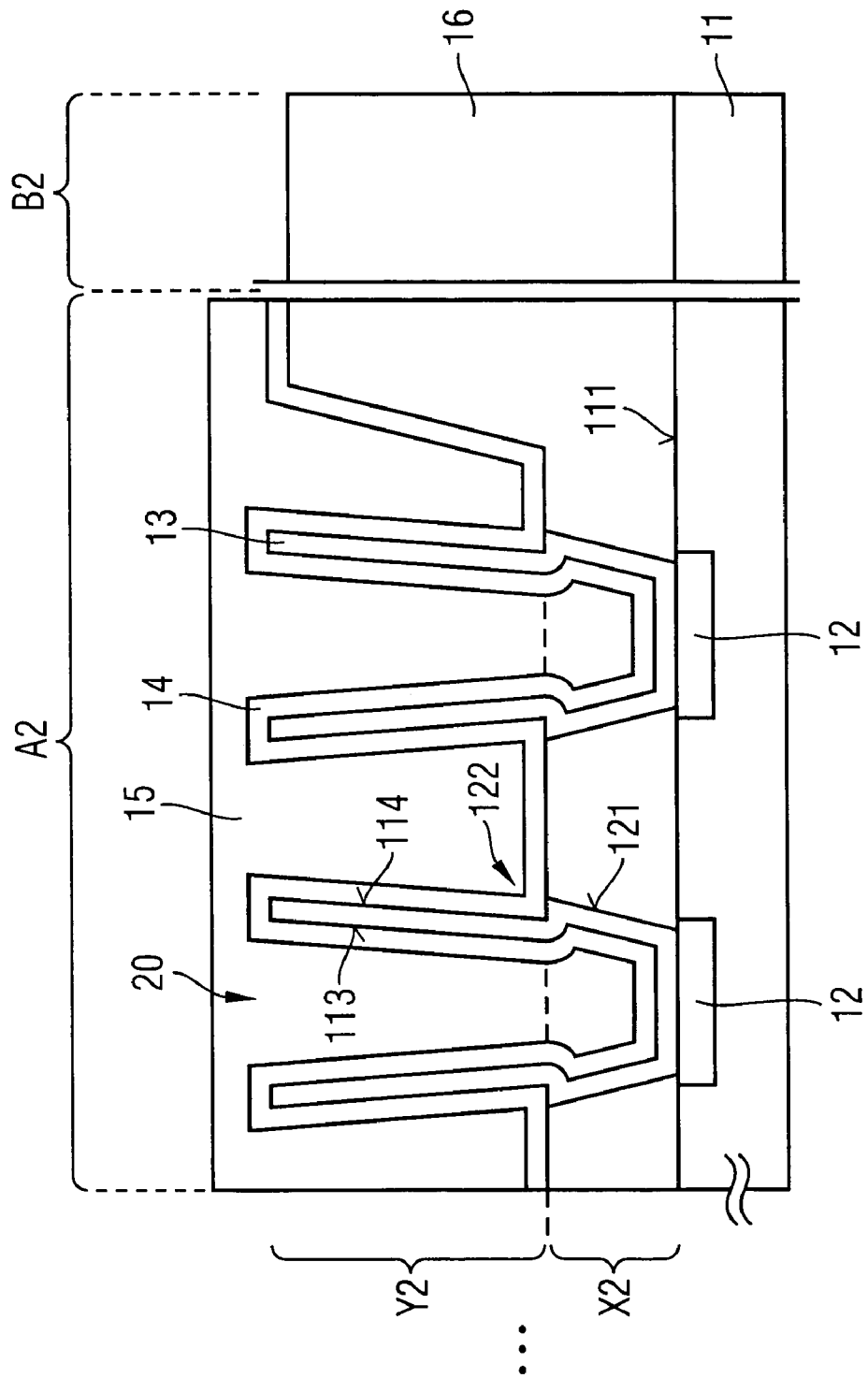

METHOD FOR FABRICATING A SEMICONDUCTOR COMPONENT AND SEMICONDUCTOR COMPONENT

BACKGROUND OF THE INVENTION

The present invention relates to a method for fabricating a semiconductor component and to a semiconductor component.

Although the problem area of the present invention is described below on the basis of a so-called crownlike capacitor device of a semiconductor memory, the present invention is not restricted thereto, but rather relates generally to a method for fabricating semiconductor components.

A semiconductor memory has a multiplicity of memory cells each comprising at least one capacitor and a transistor. A binary information item is stored as a quantity of charge in the capacitor. Access to the quantity of charge and thus the information by means of read-out and/or writing devices of the semiconductor memory is effected via the transistor of the memory cell, which is addressed by means of word and bit lines of the semiconductor memory. In order to provide semiconductor memories having a high storage density and thus a high number of memory cells on an acceptable area, the smallest possible lateral dimensions of the memory cells, that is to say both of the transistors and of the capacitors, are required.

The operation of the memory cells requires a minimum quantity of charge that can be stored in the capacitor. The quantity of charge that can be stored is substantially determined by the area content of capacitor areas of the capacitors. Therefore, provision of sufficiently large capacitance areas is to be ensured despite the reduction of the lateral dimensions.

U.S. Pat. No. 5,652,165 describes such a capacitor having a so-called crown-shaped capacitor. The crown-shaped capacitor has at least one first cup-shaped electrode having inner surfaces and outer surfaces opposite to the inner surfaces, which run perpendicular to a semiconductor substrate. The inner and also the outer surfaces are completely covered by a dielectric, on which the second electrode is applied. A capacitor area of the crown-shaped capacitor thus essentially comprises both the inner, and also the outer, perpendicularly running surface.

A generally known fabrication method for the crown-shaped capacitor firstly requires the provision of the cup-shaped first electrode having uncovered inner and outer surfaces. In this case, the first electrode has only a low mechanical stability at this point in time in the method for fabricating the crown-shaped capacitor. In particular, this is the case when the first electrode has a substantially larger vertical dimension than horizontal dimension in order, as required previously, to provide a large capacitor area in conjunction with a small lateral space requirement.

For the fabrication of the first electrodes, liquids are used, inter alia for etching and/or cleaning the first electrode. On account of the liquids between adjacent first electrodes, a capillary force acts on said adjacent first electrodes in such a way that upper sections of the adjacent first electrodes approach one another. Since the first electrodes have only a low mechanical stability, the first electrodes can approach one another to such an extent that they actually touch one another. This is one of several possible effects on account of which the first electrodes approach one another. Adhesive effects, for example on account of electrostatic charges, prevent first electrodes, once touching one another, from being released from one another again even if the liquids are removed and the capillary force is no longer acting. This leads to desirable electrical contact-making between the adjacent first electrodes and possibly to short circuits during operation of the memory device.

BRIEF SUMMARY OF THE INVENTION

The method according to the invention for fabricating a semiconductor component, in particular a capacitor device for a semiconductor memory, provides the following steps. After provision of a semiconductor substrate comprising a first surface, a shaping matrix is applied to the first surface, the matrix for shaping comprising at least one continuous depressions above contact regions in the region of the first surface, so that the contact regions are uncovered or are partly uncovered. Afterwards, a sacrificial layer is applied to sidewalls of the continuous depression from an upper section of the depression remote from the first surface. Application of a first conductive layer in a lower section of the depression and to the sacrificial layer in order to produce a first electrode is followed by removal of the sacrificial layer in order to uncover the sidewalls of the matrix in the upper section. Finally, a dielectric layer is applied to the first conductive layer and a second conductive layer is applied to the dielectric layer in order to form the second electrode. The shaping matrix may particularly be provided as a one-piece shaping matrix.

The capacitor device according to the invention comprises a semiconductor substrate comprised of contact regions, at least one first cup-shaped electrode, which is arranged on the contact regions a dielectric layer, which is arranged on an inwardly directed surface of the cup-shaped electrode and in an upper section remote from the semiconductor substrate on an outwardly directed surface of the cup-shaped electrode, and a second electrode, which is arranged as a conductive layer on the dielectric layer.

An essential step of the present invention is that the shaping matrix remains at least partially between two adjacent cup-shaped electrodes. This prevents the adjacent electrodes from being able to touch one another.

A cup-shaped electrode has a base area and an elevated edge connected to an outer periphery of the base area. The diameter of the base area is at least ten times greater than a thickness of the edge. A height of the edge may be substantially greater than the diameter of the base area. The edge may run vertically with respect to the base area or be inclined convexly or concavely with respect to an axis of the electrode.

In a restricted version of the inventive method, the continuous depression in the region of the upper section comprises a cross section that decreases in the direction toward the first surface. The direction is essentially perpendicular to that of the first surface. The cross section essentially runs parallel to the first surface. A first cross section is smaller, that is to say has a smaller area, and a second cross section if the first cross section runs closer to the first surface than the second cross section.

In a further restricted version of the inventive method, the sacrificial layer is applied with a thickness that decreases in the direction toward the first surface. In this case, it is possible to ensure in a simple manner that the lower section has no sacrificial layer by virtue of the thickness of the sacrificial layer decreasing to zero toward the lower section.

The sacrificial layer may be applied by means of an atomic layer deposition method. This method makes it possible to set a thickness profile of the sacrificial layer in a particularly precise manner. In particular, it is possible to achieve a lower deposition rate or no deposition by means of a targeted depletion of reaction gases of the deposition method in the deeper regions, that is to say close to or in the lower section of the continuous depression. Correspondingly, a thinner sacrificial layer or no sacrificial layer is thereby applied on the sidewall.

Prior to the application of the dielectric layer, the matrix may be removed only in the upper section. Consequently, the outer surface of the conductive layer in the upper section becomes better accessible for the application of the dielectric layer. At the same time, a sufficient mechanical stability of the conductive layer is ensured since the matrix is not removed in the lower section.

After the application of the sacrificial layer and prior to the application of the first conductive layer the sidewalls may be etched in the lower section, which are not covered by the sacrificial layer. Firstly this advantageously results in an increase in the surface area and thus in a capacitance of the subsequent capacitor device that is patterned in the matrix. Secondly, a thickening of the first conductive layer is formed at the transition between the upper and lower sections, since a surface running partly to the first surface is formed in this region as a result of the etching-back, the thickening advantageously increasing the mechanical stability of the first electrode during the fabrication method.

The first cup-shaped electrode may have, in a lower section, a widening of a cross section parallel to the first surface.

BRIEF DESCRIPTION OF THE SEVERAL VIEWS OF DRAWINGS

FIGS. 1a to 1g are various partial sections for illustrating a first exemplary embodiment of an inventive fabrication method.

FIGS. 2a to 2h are various partial sections for illustrating a second exemplary embodiment of an inventive fabrication method.

DESCRIPTION OF THE INVENTION

Figure 1G:
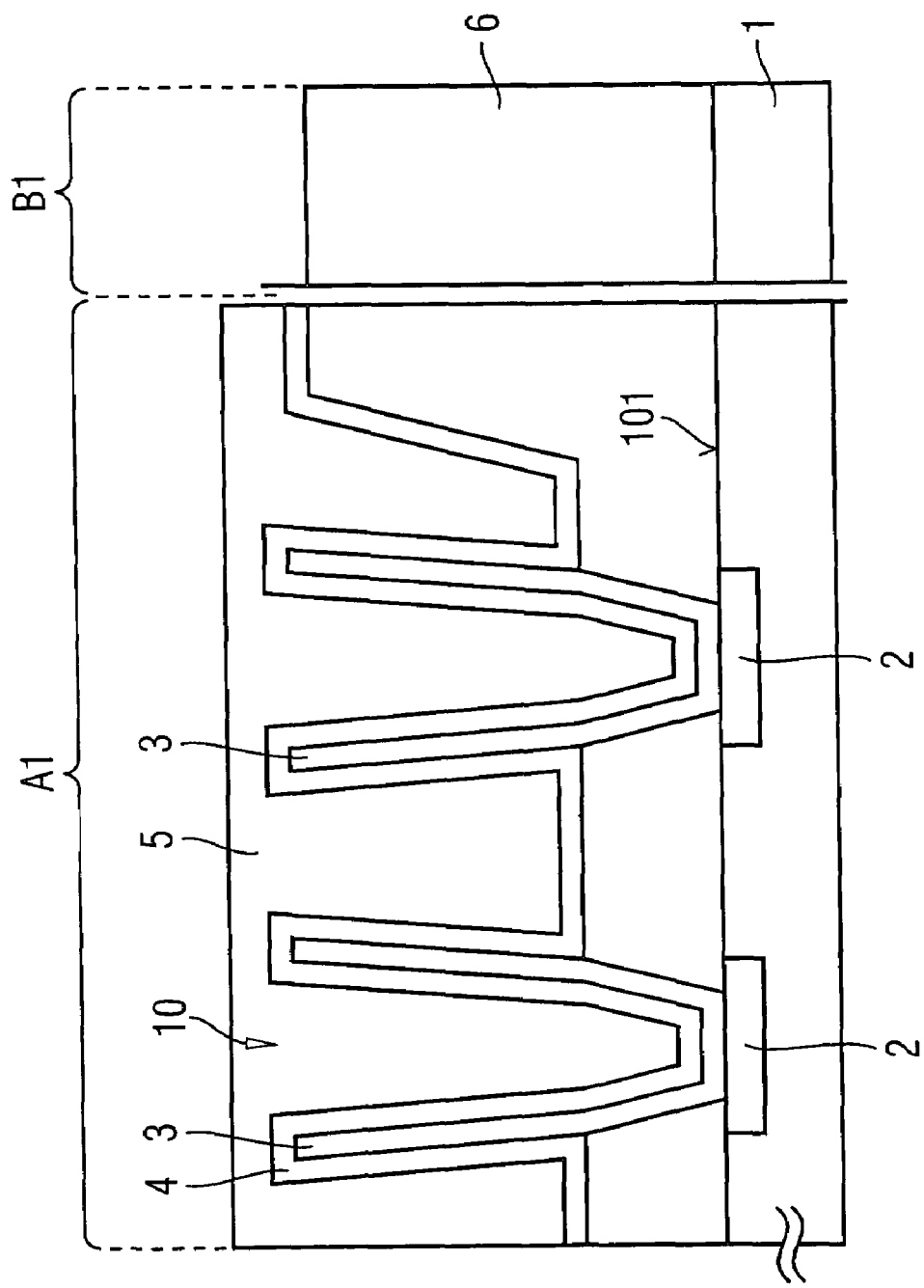
Figure 2D:
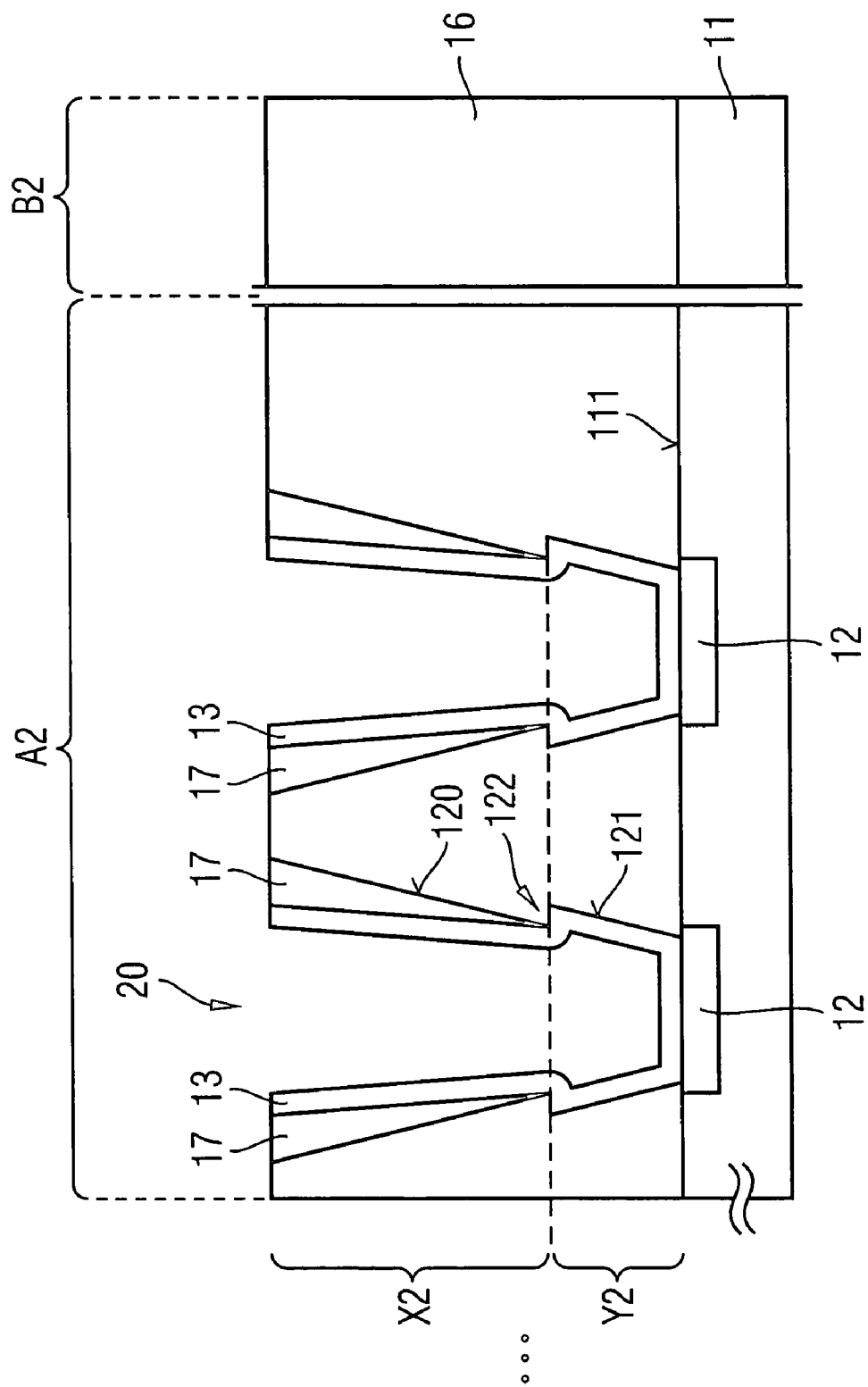

A particularly preferred exemplary embodiment of the present invention is explained below with reference to FIGS. 1a to 1g.

A semiconductor substrate 1 has a first section A1 and a second section B1 (FIG. 1a). In the first section A1, contact regions 2 are arranged in the region of the first surface 101 of the semiconductor substrate 1. A capacitor device is applied on said contact regions 2 by means of the method described below. For this purpose, in a first step, a shaping matrix 6 is applied to the first surface 101 of the semiconductor substrate 1. Typically, the shaping matrix is formed by a single material and is formed as one piece. Continuous depressions 10 are introduced into said matrix 6, so that the contract regions 2 are not covered by the matrix 6 or are at least partly uncovered. The continuous depressions 10 have sidewalls 110 running toward the contact regions 2, as a result of which the cross section of the continuous depression 10 decreases toward the semiconductor substrate 1. It is furthermore also possible to use continuous depressions 10 which have sidewalls 110 situated vertically on the first surface 110. One function of the matrix 6 is to provide a mould and/or mechanical support for layers subsequently applied to the matrix 6.

The mask 6 preferably additionally covers the entire second section B1 in order to provide a largely planar surface for subsequent steps that are not explained here.

The continuous depression 10 is subdivided into an upper section X1 and a lower section Y1 (FIG. 1b). The lower section Y1 adjoins the semiconductor substrate 1 and the upper section X1 is correspondingly arranged such that it is remote or spaced apart from the semiconductor substrate 1.

Exclusively in the upper section X1 a sacrificial layer 7 is applied to the side areas 110 of the depressions 10. The sacrificial layer 7 preferably has a thickness that decreases in the direction 200 toward the first surface 110. However, it is likewise possible to apply a sacrificial layer 7 of essentially uniform thickness in the upper section X1. What is important is that the sacrificial layer 7 is not applied to the sidewalls 110 in the lower section Y1. This ensures that in subsequent etching processes or other patterning processes, such as e.g. doping steps, to the greatest possible extent only the side area 110 in the region of the upper section X1 is altered and the side area 110 in the region of the lower section Y1 is masked. Furthermore, it is also possible for the regions in the lower section Y1 to be etched selectively with respect to the upper section with the aid of the sacrificial layer 7. The sacrificial layer 7 thus generally affords the possibility of applying different fabrication steps to the upper and lower sections.

The sacrificial layer 7 is preferably applied by means of an atomic deposition method, for example a so-called ALD process (ALD=Atomic Layer Deposition). Other methods, such as e.g. a chemical deposition method (CVD) can likewise be used.

A sacrificial layer thickness that decreases in the direction 200 can be achieved by depleting reaction gases of the deposition method in the depression 10. The parameters of the deposition method are set in such a way that at least some reaction gases are not transported, or are transported only in a small quantity, right into the lower section Y1. As a result, the deposition rate decreases in these regions and the thickness of the sacrificial layer correspondingly becomes smaller. A vertical extent, that is to say in the direction 200 of the sacrificial layer 7, is set with high accuracy in this way.

In a subsequent step, a conductive layer 3 is applied to the matrix 6. In this case, the collective layer 3 covers the sacrificial layer 7 in the upper section X1 and the sidewall 110 of the matrix 6 in the lower section Y1. Furthermore, the conductive layer 3 at least partly covers the contact-making region 2, as a result of which an electrical insipient contact-making is provided. The conductive layer 3 forms a first electrode, which is cup-shaped or cone-shaped, that is to say is composed of a plurality of cup-shaped structures. Reference is made hereinafter only to a cup-shaped electrode, but this also includes crown-shaped electrodes.

The sacrificial layer 7 is then removed (FIG. 1d). This is preferably achieved by means of a selective etching process. In this case, selective means that the sacrificial layer 7 is removed and the matrix 6 and the conductive layer 3 are at least essentially not removed. After the removal of the sacrificial layer 7, the regions in the upper section X1 of the cup-shaped electrode stand free. Consequently, the entire uncovered surface of the cup-shaped-shaped electrode has not only through the inner region of the inwardly facing surfaces 103 but also the outwardly facing surface 104 that previously adjoined the sacrificial layer 7.

A mechanical stability of the cup-shaped electrode is ensured by virtue of the fact that the matrix 6 supports the first conductive layer 3 in the lower section Y1. Moreover, the matrix 6 between two adjacent electrodes prevents the latter from being able to touch one another.

In a further step that is preferred, but can also be carried out optionally, the matrix 6 may be removed in the region of the upper section X1, e.g. by etching (FIG. 1e), in order that the outer surfaces 104 of the conductive layer 3 are more easily accessible for subsequent deposition processes. The matrix 6 is removed between two first electrodes both from the upwardly directed surface remote from the semiconductor substrate 1 and from the side areas 110 that are uncovered in the region of the upper section X1. As a result, the matrix 6 is removed significantly more rapidly in the region of the upper section X1 than in uncovered regions. Consequently, in the case of a time-controlled removal of the matrix 6, essentially only the matrix in the upper section X1 is removed. Therefore, the precisely settable vertical extent of the sacrificial layer 6 defines the region that is to be uncovered by the matrix 6.

A first region in which the matrix 6 remains is for example the entire second section B1. This is desirable inter alia in order to avoid the necessity of again applying, in the second section B1, a new mask or matrix for steps for fabricating the semiconductor component that are not explained in further detail here. A second region in which the matrix 6 remains is the lower section Y1, which can likewise only be removed from a surface remote from the first surface 101. The remaining portion of the matrix 6 advantageously increases the mechanical stability of the first electrode.

In a further processing step, a dielectric layer 4 is deposited in the direction 200 toward the first surface 101 (FIG. 1f). A conductive layer 5 is then deposited in order to form the second electrode (FIG. 1g).

A further configuration of the present invention is explained with reference to FIGS. 2a to 2h. Firstly, a semiconductor substrate 11 is provided, which is subdivided into first sections A2 and second sections B2. In the first sections A2, contact regions 12 are arranged at the first surface 111 of the semiconductor substrate 11. In the first section A2 and also in the second section B2, a matrix is applied on the first surface 111. Said matrix has continuous depressions 20 arranged in such a way that the contact regions 12 are at least partly uncovered, that is to say are not completely covered by the matrix 16. As in the first configuration, sidewalls 120 of the continuous depression 20 may be oriented perpendicularly or obliquely with respect to the first surface 111.

In a subsequent step, analogously to the first configuration, in an upper section X2 of the continuous depressions 20, sacrificial layers 17 are applied to the sidewalls 120. The sacrificial layers 17 may again be deposited homogeneously or have a thickness that tapers toward the first surface 111 in the direction 210. In the lower section Y2, which is adjacent to the first surface 111, no sacrificial layer 17 is applied to the sidewalls 120 (FIG. 2b).

The sidewalls 120 of the continuous depression 20 are removed selectively with respect to the sacrificial layer 17 (FIG. 2c). The lower region Y2 of the continuous depression 20 is thereby expanded. FIG. 2c illustrates an etched-back sidewall 121 in the lower section Y2, which essentially runs parallel to the original sidewall 120. However, this is only one of many possible configurations. A further configuration provides for producing a sidewall 121 having a curved surface in the lower region. In the boundary region 122 between the upper and lower sections X2, Y2, a surface that at least partly runs essentially parallel to the first surface 111 is produced on account of the etching-back.

One advantage of the etched-back sidewall 121 is that the total surface area of the continuous depression 20 is thereby increased. Proceeding from this increased total surface area, a significantly increased capacitor area of the capacitor device is achieved by means of the subsequent processing steps.

Afterward, the subsequent fabrication steps are carried out analogously to the first exemplary embodiment, in accordance with FIGS. 1b to 1g. A first conductive layer 13 is deposited in the continuous depression 20, said layer producing the first electrode of the capacitor device. The first conductive layer 13 is deposited on the sacrificial layer 17 in the upper section X2 and on the contact region 12 and on the etched-back sidewall 121 in the lower section Y2. A widening or thickening of the first conductive layer 13 is produced in an upper region of the lower section Y2, that is to say close to the sacrificial layer 17, since the surface of the continuous depression 20 that at least partly runs parallel to the first surface 111 is situated in this region. The thickening 122 which thus arises results in a higher stiffness of the first conductive layer 13 during the fabrication method and hence of the cup-shaped electrode.

In a subsequent step, the sacrificial layer 17 is removed analogously to the first configuration. Consequently, the outer surface 114 of the first conductive layer 13 is uncovered in the upper section X2 (FIG. 2e). The matrix 16 may optionally be removed in the upper section X2 (FIG. 2f). A dielectric layer 14 and a second electrically conductive layer 15 are applied in accordance with the first configuration (FIGS. 2g and 2h). This configuration shows that the dielectric layer 14 has a larger surface area than in the first configuration. Moreover, the higher stiffness on account of the thickening 122 ensures that the upper sections Y2 of the first cup-shaped-shaped electrodes do not touch one another.

Diverse variation possibilities arise for the choice of the materials of the matrix, of the first and second electrodes, and also of the dielectric layer. The matrix may have, inter alia, silicon oxide or a silicate glass, borosilicate glass. The conductive layers preferably contain titanium, titanium nitride, highly doped polysilicon or other conductive materials. The dielectric layers may have silicon oxide, aluminum oxide or dielectric materials having a high permittivity.

Although the present invention has been described on the basis of preferred exemplary embodiments, it is not restricted thereto.

Besides the ALD method mentioned and the CVD method, diverse further methods can be used for the application of the sacrificial layer.

The first electrode may be cup-shaped or be composed of a multiplicity of cup-shaped structures to form a crown-shaped electrode, cup-shaped encompassing cylindrical, funnel-shaped or other forms that open out convexly away from the first surface.

Within a cup-shaped electrode, there may be arranged one or a plurality of electrodes like a plurality of nested bowls.

Although modifications and changes may be suggested by those skilled in the art, it is an intention of the inventor to embody within the patent warranted heron all changes and modifications as reasonably and properly come within the scope of her contribution to the art.

What is claimed is:

1. A method for fabricating an integrated circuit having a component, comprising:

providing a substrate comprising a first surface;

forming a mold on said first surface, said mold comprising at least one depression arranged in such a way that a contact region in a region of said first surface is at least partly uncovered, and wherein the depression comprises a lower section abutting the first surface and an upper section overlying the lower section and remote from the first surface;

forming a sacrificial layer on sidewalls of said depression in solely the upper section of said depression, wherein the lower section of the depression is not covered with the sacrificial layer;

forming a first electrode by applying a first conductive layer in the lower section of said depression and to said sacrificial layer in the upper section of said depression;

removing said sacrificial layer in order to uncover said sidewalls of said mold in said upper section;

applying a dielectric layer to said first conductive layer; and forming a second electrode by applying a second conductive layer to said dielectric layer.

2. The method of claim 1, wherein said depression comprises, in a region of said upper section, a cross section that decreases in a direction toward said first surface.

3. The method of claim 1, wherein applying the sacrificial layer comprises applying said sacrificial layer with a thickness that decreases in a direction toward said first surface.

4. The method of claim 1, wherein applying the sacrificial layer comprises applying said sacrificial layer by means of an atomic layer deposition method.

5. The method of claim 1, further comprising, prior to applying said dielectric layer, removing said mold only in said upper section.

6. The method of claim 1, further comprising, after applying said sacrificial layer and prior to applying said first conductive layer, etching said sidewalls of the mold in said lower section of the depression, which are not covered by said sacrificial layer.

7. The method of claim 1, wherein said component is a capacitor device for a semiconductor memory.

8. The method of claim 1, wherein producing the first electrode results in the first electrode having an inwardly facing surface opposite the depression and the sacrificial layer, and wherein removing the sacrificial layer exposes an outwardly facing surface of the first electrode in the upper section of the depression, and wherein applying the dielectric layer results in the dielectric layer overlying both the inwardly facing surface and the outwardly facing surface of the first electrode.

9. The method of claim 8, wherein forming the second electrode comprises overlying the dielectric layer in regions corresponding to both the inwardly facing surface and the outwardly facing surface of the first electrode.

10. A method of forming an integrated circuit comprising a capacitor, comprising:

forming a mold over a first surface of a substrate;

forming a depression in the mold to uncover a contact region, the contact region being disposed in a region of the first surface;

forming a sacrificial layer after forming the depression, the sacrificial layer covering a sidewall of an upper section of the depression, and leaving a lower section of the depression uncovered with respect to the sacrificial layer;

forming a conductive layer over the lower and the upper sections of the depression, thereby forming a first electrode;

removing the sacrificial layer;

forming a dielectric layer over the first electrode; and forming a second conductive layer over the dielectric layer to form a second electrode.

* * * * *